(12) United States Patent
Homoth et al.

(10) Patent No.: US 12,557,673 B2
(45) Date of Patent: Feb. 17, 2026

(54) ELECTRONIC CIRCUIT MODULE

(71) Applicant: Robert Bosch GmbH, Stuttgart (DE)

(72) Inventors: Jan Homoth, Reutlingen (DE);
Christian Foerster, Reutlingen (DE);
Thomas Sonntag, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 393 days.

(21) Appl. No.: 18/040,168

(22) PCT Filed: Jul. 22, 2021

(86) PCT No.: PCT/EP2021/070585
§ 371 (c)(1),
(2) Date: Feb. 1, 2023

(87) PCT Pub. No.: WO2022/028915
PCT Pub. Date: Feb. 10, 2022

(65) Prior Publication Data
US 2023/0268278 A1 Aug. 24, 2023

(30) Foreign Application Priority Data
Aug. 3, 2020 (DE) ............ 10 2020 209 752.6

(51) Int. Cl.
*H01L 29/15* (2006.01)
*H01L 21/56* (2006.01)
(Continued)

(52) U.S. Cl.
CPC .......... *H01L 23/5383* (2013.01); *H01L 21/56* (2013.01); *H01L 24/08* (2013.01);
(Continued)

(58) Field of Classification Search
CPC ..... H01L 23/5383; H01L 21/56; H01L 24/08; H01L 24/80; H01L 24/48; H01L 25/16;
(Continued)

(56) References Cited

U.S. PATENT DOCUMENTS

| 2003/0169575 A1 | 9/2003 | Ikuta et al. |
| 2007/0231826 A1 | 10/2007 | Huber et al. |

(Continued)

FOREIGN PATENT DOCUMENTS

| DE | 102005037456 A1 | 2/2007 |
| DE | 102008040906 A1 | 2/2010 |

(Continued)

OTHER PUBLICATIONS

International Search Report for PCT/EP2021/070585, Issued Nov. 5, 2021.

*Primary Examiner* — Niki H Nguyen
(74) *Attorney, Agent, or Firm* — NORTON ROSE FULBRIGHT US LLP

(57) ABSTRACT

An electronic circuit module. The module has a multilayered LTCC circuit carrier made of structured inorganic substrate layers, which have electrical and/or thermal conduction structures for electrical and/or thermal conduction, at least one electronic component, which is arranged on a first side and/or an opposite second side of the LTCC circuit carrier, and at least one SiC power semiconductor. The at least one SiC power semiconductor is embedded in the multilayered LTCC circuit carrier and enclosed at least on three sides by the multilayered LTCC circuit carrier. Connection contacts of the SiC power semiconductor contact the electrical and/or thermal conduction structures of the LTCC circuit carrier.

13 Claims, 3 Drawing Sheets

(51) Int. Cl.
*H01L 23/00* (2006.01)
*H01L 23/538* (2006.01)
*H01L 31/0312* (2006.01)
*H01L 25/16* (2023.01)

(52) U.S. Cl.
CPC .............. *H01L 24/80* (2013.01); *H01L 24/48* (2013.01); *H01L 25/16* (2013.01); *H01L 2224/08225* (2013.01); *H01L 2224/48091* (2013.01); *H01L 2224/48235* (2013.01); *H01L 2224/8084* (2013.01); *H01L 2924/10272* (2013.01); *H01L 2924/13091* (2013.01); *H01L 2924/1431* (2013.01)

(58) Field of Classification Search
CPC . H01L 2224/08225; H01L 2224/48091; H01L 2224/48235; H01L 2224/8084; H01L 2924/10272; H01L 2924/13091; H01L 2924/1431; H01L 2924/13055; H01L 2924/1305; H01L 25/072; H01L 2224/48247; H01L 25/18; H01L 2924/1306; H01L 2224/06181; H01L 2224/40137; H01L 25/115; H01L 2924/19043; H01L 2924/19041; H01L 23/50; H01L 64/311
See application file for complete search history.

(56) References Cited

U.S. PATENT DOCUMENTS

| | | |
|---|---|---|
| 2010/0059165 A1 | 3/2010 | Choo et al. |
| 2011/0148545 A1 | 6/2011 | Choudhury et al. |
| 2014/0342679 A1 | 11/2014 | Choudhury et al. |
| 2018/0027667 A1* | 1/2018 | Bueyuekgoez ........ H05K 1/115 174/250 |

FOREIGN PATENT DOCUMENTS

| | | | |
|---|---|---|---|
| DE | 102015202669 A1 | 9/2016 | |
| DE | 102016214607 A1 | 2/2018 | |
| DE | 102016224943 A1 | 6/2018 | |
| DE | 102018102144 A1 | 8/2019 | |
| EP | 3547359 A1 * | 10/2019 | ............ H01L 24/19 |
| JP | 2002299775 A | 10/2002 | |
| JP | 2010062566 A | 3/2010 | |
| WO | 2005013363 A2 | 2/2005 | |

* cited by examiner

ELECTRONIC CIRCUIT MODULE

FIELD

The present invention relates to an electronic circuit module. An object of the present invention is also to provide a method for manufacturing a multilayered LTCC circuit carrier for an electronic circuit module of this type.

BACKGROUND INFORMATION

Described in the related art are power modules in which silicon carbide power semiconductors (SiC power semiconductors) are designed as MOSFET power switches and are first mounted on an AMB substrate (AMB: Active Metal Brazed) by silver sintering, wherein silver sintering is a specific assembly and interconnection technology at a low sintering temperature of <300° C. A solder platelet is subsequently sintered onto the SiC power semiconductors again by silver sintering. A solder is in turn applied to this solder platelet, which is subsequently used for soldering with one side of a multilayered LTCC multilayer substrate. In other words, after the SiC power semiconductors have been sintered onto the AMB substrate, four further process steps are performed until the LTCC multilayer substrate has also been connected.

German Patent Application No. DE 10 2015 202 669 A1 describes an electronic circuit module according to the species comprising a multilayered LTCC circuit carrier made of structured inorganic substrate layers, which have electrical and/or thermal conduction structures for electrical and/or thermal conduction, at least one electronic component, which is arranged on a first side and/or an opposite second side of the LTCC circuit carrier, and at least one SiC power semiconductor, as well as a method according to the species for producing such an LTCC circuit carrier. In this case, a partial metallization of the electrical and/or thermal conduction structures is developed as an insert, which fills a correspondingly shaped hole introduced into one of the inorganic substrate layers. In the manufacture of the LTCC circuit carrier, at least one shaped hole for a corresponding insert is introduced into at least one unburned raw material layer. The insert is subsequently inserted into the shaped hole, and the raw material layer is burned with the insert in a constraint sintering process to form a corresponding inorganic substrate layer. In the constraint sintering process, material shrinkage is substantially limited to the thickness of the raw material layer, so that the corresponding inorganic substrate layer is thinner than the raw material layer.

SUMMARY

An advantage of the electronic circuit module having the features of the present invention is that at least one silicon carbide power semiconductor (SiC power semiconductor) is already embedded or integrated into an LTCC circuit carrier during the manufacture thereof. Embedding the SiC power semiconductor in the LTCC circuit carrier achieves contact of the at least one SiC power semiconductor in the interior of the LTCC circuit carrier, thus protecting the SiC power conductor from external influences. As a result, the connection contacts of the SiC power semiconductor on a front side and/or rear side of the SiC power semiconductor can be designed in a simpler and markedly more cost-effective manner. Furthermore, the spatial positioning of the SiC power semiconductors can be performed with markedly greater accuracy. Depending on the design variant, the semiconductor terminates in a precisely flush manner with a bottom side or top side of the LTCC circuit carrier, or it is completely embedded in the interior of the LTCC circuit carrier. A defined projection beyond the LTCC circuit carrier in an upward or downward direction is also possible. Due to the high sintering temperature of 900° C., the electrical and/or thermal connections within the LTCC circuit carrier are far more temperature resistant than a solder and/or silver sintered connection performed at lower temperatures. Because the LTCC circuit carrier and the at least one SiC power semiconductor are made of ceramic materials, they exhibit approximately the same coefficient of expansion. As a result, the described integration of the at least one SiC power semiconductor can be directly achieved during the manufacturing process of the LTCC circuit carrier. This allows for optimum tuning of the functional metallic connections and the subsequent process chains with correspondingly large potential savings.

Example embodiments of the present invention provide an electronic circuit module having a multilayered LTCC circuit carrier made of structured inorganic substrate layers, which have electrical and/or thermal conduction structures for electrical and/or thermal conduction, at least one electronic component, which is arranged on a first side and/or an opposite second side of the LTCC circuit carrier, and at least one SiC power semiconductor. In this case, the at least one SiC power semiconductor is embedded in the multilayered LTCC circuit carrier and enclosed at least on three sides by the multilayered LTCC circuit carrier, wherein connection contacts of the SiC power semiconductor contact the electrical and/or thermal conduction structures of the LTCC circuit carrier.

Further provided according to the present invention is a method used for manufacturing a multilayered LTCC circuit carrier for such an electronic circuit module. According to an example embodiment of the present invention, tor this purpose, at least one recess for a corresponding SiC power semiconductor is formed in at least one raw substrate layer with electrical and/or thermal conduction structures, wherein several raw substrate layers are stacked, and at least one SiC power semiconductor is inserted into the at least one recess. The raw substrate stack with the SiC power semiconductor is laminated under pressure and temperature. The laminated raw substrate stack is shrunk in a pressure-assisted sintering process to form the LTCC multilayer circuit carrier with the embedded SiC power semiconductor, wherein connection contacts of the SiC power semiconductor are, by means of the pressure-assisted sintering process, brought into contact with the electrical and/or thermal conduction structures of inorganic substrate layers, which are produced by the pressure-assisted sintering process from the raw substrate layers with electrical and/or thermal conduction structures.

By means of the measures and further developments disclosed herein, advantageous improvements to the electronic circuit module of the present invention as well as the method according to the present invention for producing a multilayer circuit carrier for such an electronic circuit module are made possible.

According to an example embodiment of the present invention, it is particularly advantageous that a first side of the at least one SiC power semiconductor can face a first side of the LTCC multilayer circuit carrier, and a second side of the at least one SiC power semiconductor can face a second side of the LTCC multilayer circuit carrier. The first side of the at least one SiC power semiconductor can thus correspond to its top side, and the second side can correspond to its rear side. The first side of the multilayered LTCC circuit carrier can, in a similar manner, correspond to its top side, and the second side can correspond to its bottom side.

In one advantageous embodiment of the electronic circuit module of the present invention, the at least one SiC power semiconductor can fill in a corresponding recess which is introduced into at least one inorganic substrate layer. As a result, the at least one SiC power semiconductor can be electrically and/or thermally contacted in a straightforward manner at both its top and bottom sides by corresponding electrical and/or thermal conduction contours formed at a bottom side of a substrate layer arranged directly above the at least one SiC power semiconductor, or at a top side of a substrate layer arranged directly below the at least one SiC power semiconductor.

In a further advantageous embodiment of the electronic circuit module of the present invention, at least one connection contact on the first side, or on the second side, of the at least one SiC power semiconductor can be electrically connected, via a through-contact, to a connection contact which is arranged on the first side, or on the second side, of the LTCC multilayer circuit carrier, or can be electrically connected to an electronic component which is arranged on the first side, or on the second side, of the LTCC multilayer circuit carrier. For example, the at least one SiC power semiconductor can be electrically connected, via through-contacts, to an electronic component designed as a logic circuit, and/or to an electronic component designed as a discrete component, which are arranged on the top side, or on the bottom side, of the LTCC circuit carrier. In this case, the discrete component can be, e.g., an ohmic resistor, an electrical coil, or an electrical capacitor.

In a further advantageous embodiment of the electronic circuit module of the present invention, a high-current conductor path can be embedded in the LTCC multilayer circuit carrier and can be electrically connected, via at least one first through-contact, to a corresponding connection contact on the first side, or on the second side, of the multilayer circuit carrier. In addition, the high-current conductor path can be electrically, via at least one second through-contact, connected to a corresponding connection contact on the first side, or on the second side, of the at least one SiC power semiconductor. Alternatively, the high-current conductor path can be electrically connected in a planar manner, via a contact surface, to a corresponding connection contact on the first side, or on the second side, of the at least one SiC power semiconductor. High currents of well over 20A can also be conducted within the LTCC circuit carrier through the high-current conductor path. This makes it possible to use embodiments of the circuit carrier according to the present invention in vehicles or stationary systems for electrical power output stages with integrated logic.

In a further advantageous embodiment of the electronic circuit module of the present invention, the first side or top side may terminate in a flush manner with the first side or top side of the multilayered LTCC circuit carrier. Alternatively, the second side or rear side of the at least one SiC power semiconductor can terminate in a flush manner with the second side or rear side of the LTCC multilayer circuit carrier. A simple electrical and/or thermal contact between the at least one SiC power semiconductor and external assemblies or devices is possible as a result. Control devices or electrical consumers, e.g. electric motors, can then make direct contact with corresponding connection contacts of the at least one SiC power semiconductor. In addition, cooling devices, e.g., heat sinks, can contact the corresponding connection contacts of the at least one SiC power semiconductor via an insulating layer which conducts well thermally but is electrically insulated.

In a further advantageous embodiment of the electronic circuit module of the present invention, a connection contact on the first side or top side or on the second side or rear side of the at least one SiC power semiconductor can be in planar contact with a thermally and electrically conductive insert or with a thermally and electrically conductive printed thick-film structure. In this case, the insert or the printed thick-film structure can terminate in a flush manner with the first side or top side or with the second side rear side of the LTCC multilayer circuit carrier. A planar electrical and/or thermal contact between the at least one SiC power semiconductor and external assemblies or devices is possible as a result.

Alternatively, the at least one SiC power semiconductor can be enclosed on all four sides by the multilayered LTCC circuit carrier. In other words, the at least one SiC power semiconductor is fully integrated into the LTCC circuit carrier.

In a further advantageous embodiment of the electronic circuit module of the present invention, the at least one SiC power semiconductor can be designed as, e.g., a MOSFET power switch.

In one advantageous embodiment of the method of the present invention, at least one further recess can be introduced into at least one raw substrate layer prior to stacking the raw substrate layers, into which further recess, during or after stacking, at least one through-contact and/or at least one high-current conductor path and/or at least one thermally and electrically conductive insert can be inserted as an additional electrical conduction structure and/or at least one thermally and electrically conductive thick-film structure can be printed as an additional electrical conduction structure. As a result, the electrically and/or thermally conductive conduction structures formed at the top sides or rear sides of the raw substrate layers can be combined with one another or with the connection contacts on the first side or top side or on the second side or rear side of the LTCC circuit carrier.

In another advantageous embodiment of the method of the present invention, the pressure-assisted sintering process can shrink the raw substrate layer in thickness so that the generated substrate layer is thinner than the raw substrate layer. In addition, a height of a recess introduced into at least one of the raw substrate layers is higher than the SiC power semiconductor, wherein the height of the recess in the at least one raw substrate layer can be selected such that the height of a shrunken recess in the at least one shrunken substrate layer corresponds to the height of the SiC power semiconductor, and the at least one SiC power semiconductor fills the corresponding shrunken recess. As a result, the substrate layers of the LTCC circuit carrier shrink precisely onto the at least one SiC power semiconductor. In the process, the electrically and/or thermally conductive conduction structures as well as conductor paths and through-contacts come into contact with the connection contacts present on the at least one SiC power semiconductor, so that the electrically and/or thermally conductive conduction structures as well as conductor paths and through-contacts are also made to sinter with the connection contacts of the at least one SiC power semiconductor and a stable electrical connection with ohmic contacts results.

Embodiment examples of the present invention are illustrated in the figures and explained in greater detail in the following description. In the figures, like reference numbers refer to components or elements performing like or similar functions.

DETAILED DESCRIPTION OF EXAMPLE EMBODIMENTS

Figure 1A:
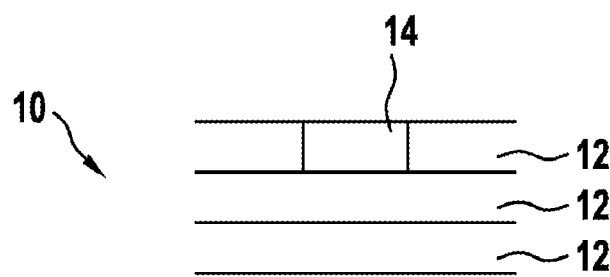
FIGS. 1A-1D show schematic sectional views showing a detail of an embodiment example of an LTCC circuit carrier during a method according to the present invention for producing a multilayered LTCC circuit carrier for an electronic circuit module according to the present invention at various points in time.
Figure 1B:
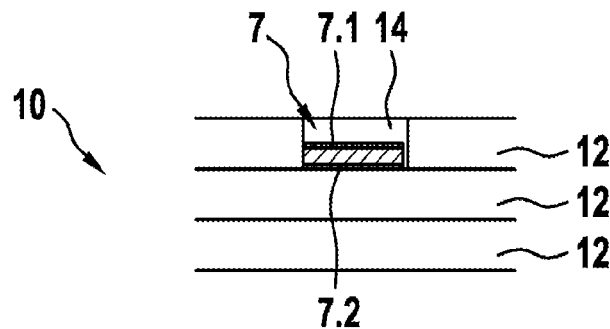
Figure 1C:
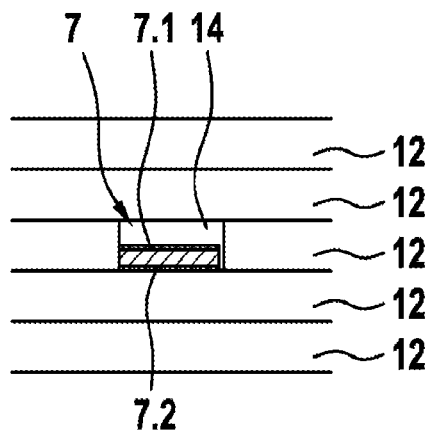
Figure 1D:
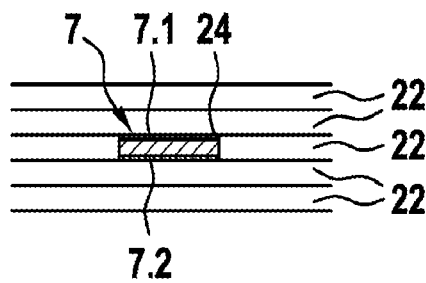
Figure 2:
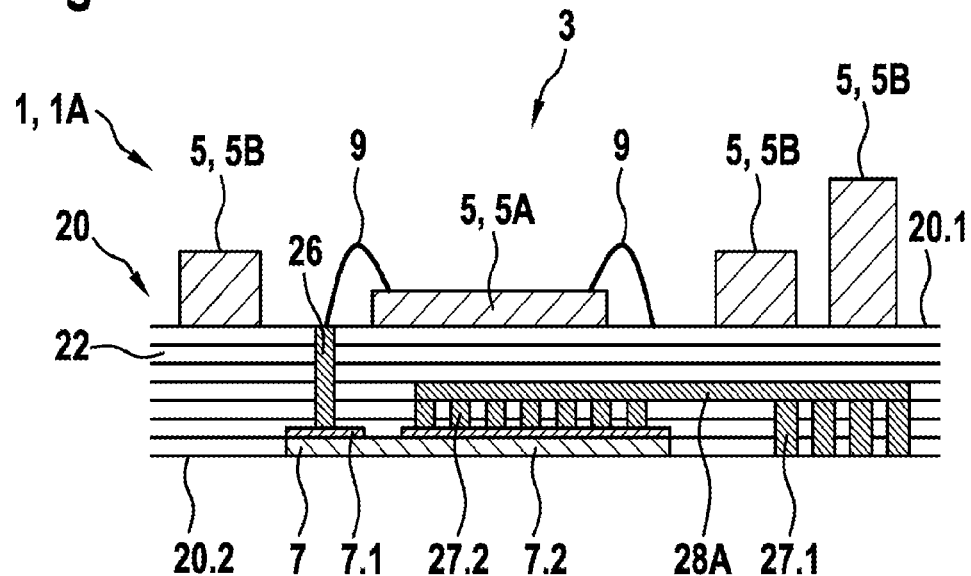
FIG. 2 is a schematic sectional view of a first embodiment example of an electronic circuit module according to the present invention.
Figure 3:
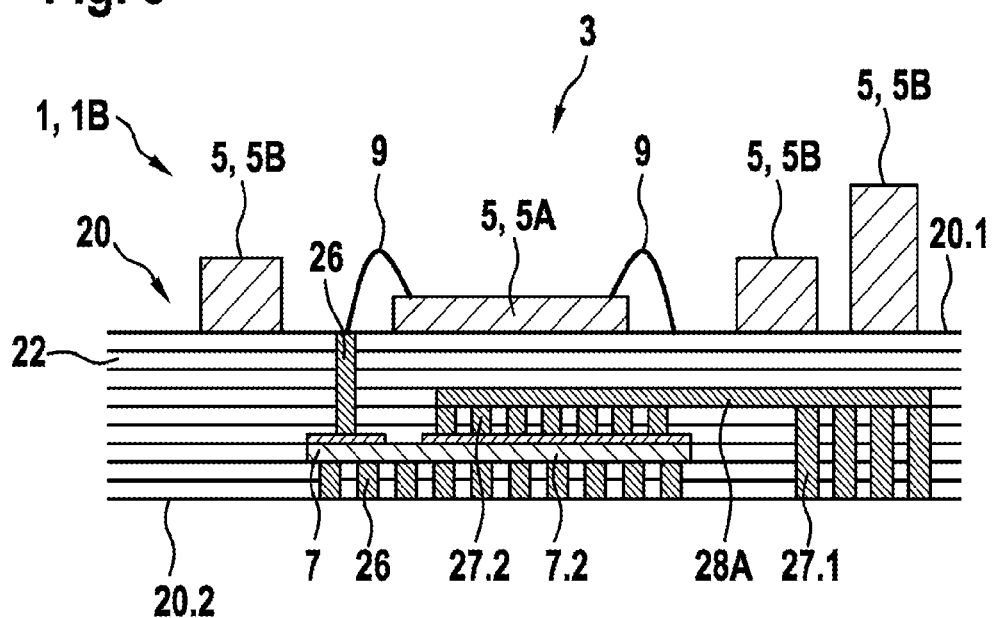
FIG. 3 is a schematic sectional view of a second embodiment example of an electronic circuit module according to the present invention.
Figure 4:
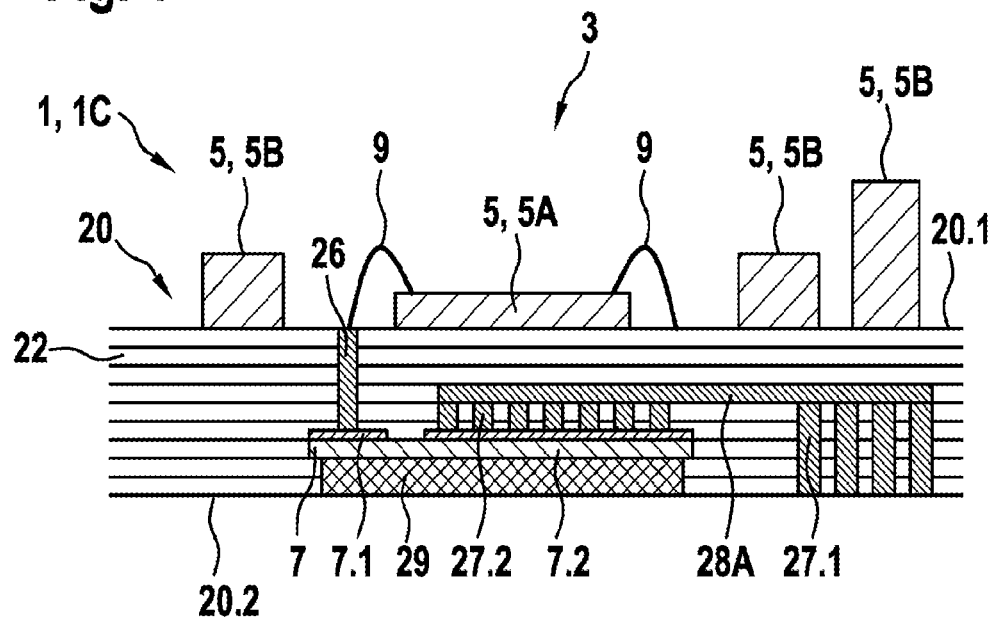
FIG. 4 is a schematic sectional view of a third embodiment example of an electronic circuit module according to the present invention.

In the method according to the present invention for producing a multilayered LTCC circuit carrier 20 for an electronic circuit module 1, 1A, 1B, 1C, 1D according to the present invention, as shown in FIGS. 2 to 4, at least one recess 14 for a corresponding SiC power semiconductor 7 is introduced into at least one raw substrate layer 12 having electrical and/or thermal conduction structures, several raw substrate layers 12 being stacked to form a raw substrate stack 10, as shown in FIG. 1A. The recess 14 is larger, in particular higher, than the at least one SiC power semiconductor 7 and can be introduced into the at least one raw substrate layer 12 by means of, e.g., punching. The raw substrate layer 12 is preferably designed as a film, on the top and bottom sides of which predetermined electrically and/or thermally conductive conduction structures (not indicated in further detail) are applied. During the stacking of the raw substrate stack 10, the at least one SiC power semiconductor is correctly positioned in the corresponding recess 14, as can be seen in FIG. 1B. The raw substrate stack 10 comprising the inserted SiC power semiconductor 7 is laminated under pressure and temperature so that the individual raw substrate layers 12 "adhere to one another", and a laminated raw substrate stack 10A is produced, shown in FIG. 1C. Due to the principle of construction of such a multilayered LTCC circuit carrier, the at least one SiC power semiconductor in the illustrated embodiment example is completely embedded in the laminated raw substrate stack 10 and thus protected. The laminated raw substrate stack 10A is shrunk in a pressure-assisted sintering process to form the multilayered LTCC circuit carrier 20 with the embedded SiC power semiconductor 7, as shown in FIG. 1D. In the pressure-assisted sintering process the connection contacts of the SiC power semiconductor 7 are brought into contact with the electrical and/or thermal conduction structures of the inorganic substrate layers 22, which are produced by the pressure-assisted sintering process from the raw substrate layers 12 comprising electrical and/or thermal conduction structures.

As can further be seen from FIG. 1, the pressure-assisted sintering process shrinks the raw substrate layer 12 in thickness or height so that the generated substrate layer 22 is thinner than the raw substrate layer 12. As can further be seen from FIG. 1B, a height of the recess 14, which is introduced into at least one of the raw substrate layers 12, is designed to be higher than the SiC power semiconductor 7, wherein the height of the recess 14 in the at least one raw substrate layer 12 is selected such that the thickness or height of a shrunken recess 24 in the at least one shrunken substrate layer 22 corresponds to the thickness or height of the SiC power semiconductor 7 and fills the shrunken recess 24, as can be seen in FIG. 1D. In addition, prior to stacking the raw substrate layers, at least one further recess is introduced into at least one raw substrate layer 12, into which, during or after stacking, at least one through-contact 26, 27.1, 27.2 and/or at least one high-current conductor track 28A, 28B and/or at least one thermally and electrically conductive insert is inserted as an additional electrical conduction structure and/or at least one thermally and electrically conductive thick-film structure 29 is printed into the further recess.

As can be seen from FIGS. 2 to 5, the illustrated embodiment examples of an electronic circuit module 1 according to the present invention each comprise a multilayered LTCC circuit carrier 20 made of structured inorganic substrate layers 22, which have electrical and/or thermal conduction structures for electrical and/or thermal conduction, at least one electronic component 5, which is arranged on a first side 20.1 and/or an opposite second side 20.2 of the LTCC circuit carrier 20, and at least one SiC power semiconductor 7. The at least one SiC power semiconductor 7 is thereby embedded in the multilayered LTCC circuit carrier 20 and is enclosed on at least three sides by the multilayered LTCC circuit carrier 20, wherein connection contacts of the SiC power semiconductor 7 contact the electrical and/or thermal conduction structures of the LTCC circuit carrier 20. The multilayered LTCC circuit carrier 20 is manufactured according to the method described above.

In the illustrated embodiment examples, the electronic circuit module 1, 1A, 1B, 1C, 1D is, by way of example, designed as a power module 3, and the at least one SiC power semiconductor 7 is designed as a MOSFET power switch.

As can be further seen from FIGS. 2 to 5, a first side 7.1 (in this case a top side) of the at least one SiC power semiconductor 7 faces a first side 20.1 (in this case a top side) of the LTCC multilayer circuit carrier 20, and a second side 7.2 (in this case a rear side) of the at least one SiC power semiconductor 7 faces a second side 20.2 (in this case a rear side) of the multilayered LTCC circuit carrier 20. In addition, the size or height or thickness of the at least one SiC power semiconductor 7 corresponds to the size or height or thickness of the corresponding recess 24 in the at least one inorganic substrate layer 22.

As can further be seen from FIGS. 2 to 4, in the illustrated section of the embodiment examples of the electronic circuit module 1, 1A, 1B, 1C, 1D, at least one connection contact on the first side 7.1 or top side of the at least one SiC power semiconductor 7 is in each case electrically connected, via a through-contact 26, to a connection contact on the first side 20.1 or top side of the multilayered LTCC circuit carrier 20, which is connected, via a bonding wire 9, to an electronic component 5, which is arranged on the first side 20.1 or top side and designed as a logic circuit 5A. The logic circuit 5A contacts an electrically conductive conduction structure via a further bonding wire 9. As can also be seen from FIGS. 2 to 4, arranged on the first side 20.1 or top side are further electronic components 5 designed as discrete components 5B and in contact with corresponding electrically conductive conduction structures. Furthermore, in the illustrated embodiment examples, a high-current conductor path 28A is in each case embedded in the multilayered LTCC circuit carrier 20 and is electrically connected, via at least one first through-contact 27.1, to a corresponding connection contact on the first side 20.1 or top side or on the second side 20.2 or bottom side of the multilayered LTCC circuit carrier 20.

As can further be seen from FIG. 2, the illustrated SiC power semiconductor 7 terminates with its second side 7.2 or rear side, which is designed as a planar metallization, in a flush manner with the second side 20.2 or rear side of the LTCC circuit carrier 20. Furthermore, in the illustrated first embodiment example of the electronic circuit module 1A, the high-current conductor path 28A is electrically connected, via several first through-contacts 27.1, to corresponding connection contacts on the second side 20.2 or bottom side of the multilayered LTCC circuit carrier 20. In addition, the high-current conductor path 28A is electrically connected, via several second through-contacts 27.2, to a corresponding connection contact on the first side 7.1 or top side of the at least one SiC power semiconductor 7.

As can further be seen from FIG. 3, the illustrated SiC power semiconductor 7 is enclosed on all four sides by the multilayered LTCC circuit carrier 20 and is thus fully integrated into the LTCC circuit carrier 20. Furthermore, in the illustrated second embodiment example of the electronic circuit module 1B, the high-current conductor path 28A is electrically connected, via several first through-contacts 27.1, to corresponding connection contacts on the second side 20.2 or bottom side of the multilayered LTCC circuit carrier 20. In addition, the high-current conductor path 28A is electrically connected, via several second through-contacts 27.2, to a corresponding connection contact on the first side 7.1 or top side of the at least one SiC power semiconductor 7. The second side 7.2 or rear side of the SiC power semiconductor 7, which is designed as a planar metallization, is electrically connected, via several through-contacts 26, to corresponding connection contacts on the second side 20.2 or rear side of the LTCC circuit carrier 20.

As can further be seen from FIG. 4, the illustrated SiC power semiconductor 7 is enclosed on three sides by the multilayered LTCC circuit carrier 20, wherein the second side 7.2 or rear side of the SiC power semiconductor 7 designed as a planar metallization is in planar contact with a thermally and electrically conductive printed thick-film structure 29. The thick-film structure 29 terminates in a flush manner with the second side 20.2 or rear side of the multilayered LTCC circuit carrier 20. The high-current conductor path 28A in the illustrated third embodiment example of the electronic circuit module 1C illustrated is electrically connected, via several first through-contacts 27.1, to corresponding connection contacts on the second side 20.2 or bottom side, of the multilayered LTCC circuit carrier 20. In addition, the high-current conductor path 28A is electrically connected, via several second through-contacts 27.2, to a corresponding connection contact on the first side 7.1 or top side of the at least one SiC power semiconductor 7. In an alternative embodiment example (not shown), the second side 7.2 or rear side of the SiC power semiconductor 7 is in planar contact with a thermally and electrically conductive insert instead of with the printed thick-film structure 29.

Figure 5:
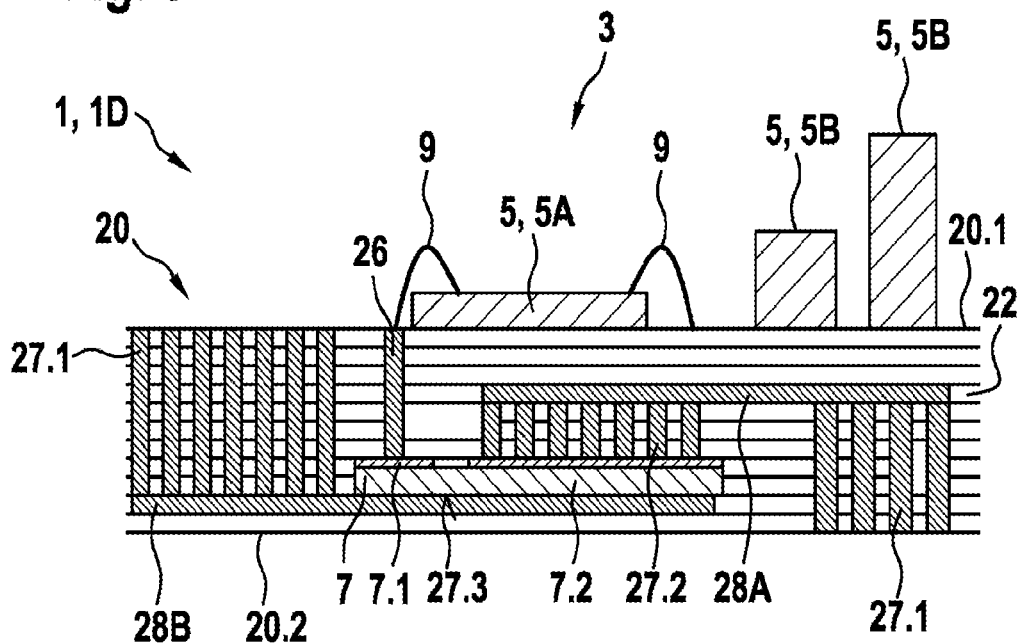
FIG. 5 is a schematic sectional view of a fourth embodiment example of an electronic circuit module according to the present invention.

As can further be seen from FIG. 5, the illustrated SiC power semiconductor 7 is enclosed on all four sides by the multilayered LTCC circuit carrier 20, wherein the second side 7.2 or rear side of the SiC power semiconductor 7 designed as a planar metallization is in planar contact with a contact surface 27.3 of a further high-current conductor path 28B, which is electrically connected, via several first through-contacts 27.1, to corresponding connection contacts on the first side 20.1 or top side of the LTCC circuit carrier 20. The high-current conductor path 28A in the illustrated third embodiment example of the electronic circuit module 1C is electrically connected, via several first through-contacts 27.1, to corresponding connection contacts on the second side 20.2 or bottom side of the multilayered LTCC circuit carrier 20. In addition, the high-current conductor path 28A is electrically connected, via several second through-contacts 27.2, to a corresponding connection contact on the first side 7.1 or top side of the at least one SiC power semiconductor 7.

Due to the high pressure during the pressure-assisted sintering process, a portion of the raw substrate layer 12 flows into the farthest cavities of the recess 24, so that the at least one SiC power semiconductor 7 in the illustrated embodiment examples is embedded in the multilayered LTCC circuit carrier 20, as can be seen in FIG. 1D and FIGS. 2 to 5. Upon this embedding, the electrical and/or thermal conduction structures, the high-current conductor paths 28A, 28B, and the through-contacts 26, 27.1, 27.2, as well as the connection contacts of the at least one SiC power semiconductor 7 come into contact with one another. Both the individual structured inorganic substrate layers 22 of the LTCC circuit carrier 20 and the silver used for the electrical and/or thermal conduction structures and conductor paths and through-contacts are sintered at 900° C. In the process, the silver is also sintered with the metallic contacts of the at least one SiC power semiconductor 7, and a stable electrical connection with ohmic contacts results.

The invention claimed is:

1. An electronic circuit module, comprising:
    a multilayered LTCC circuit carrier made of structured inorganic substrate layers, which have electrical and/or thermal conduction structures for electrical and/or thermal conduction;
    at least one electronic component, which is arranged on a first side and/or an opposite second side of the LTCC circuit carrier; and
    at least one SiC power semiconductor;
    wherein the at least one SiC power semiconductor is embedded in the LTCC multilayer circuit carrier and is enclosed at least on three sides by the LTCC multilayer circuit carrier,
    wherein connection contacts of the SiC power semiconductor contact the electrical and/or thermal conduction structures of the LTCC circuit carrier,
    wherein a first side of the at least one SiC power semiconductor faces a first side of the multilayered LTCC circuit carrier, and a second side of the at least one SiC power semiconductor faces a second side of the multilayered LTCC circuit carrier, and
    wherein a connection contact on the first side or on the second side of the at least one SiC power semiconductor is in planar contact with a thermally and electrically conductive insert or with a thermally and electrically conductive printed thick-film structure, wherein the insert or the thick-film structure terminates in a flush manner with the first side or with the second side of the multilayered LTCC circuit carrier.

2. The electronic circuit module according to claim 1, wherein the at least one SiC power semiconductor fills a corresponding recess, which is introduced into at least one inorganic substrate layer of the structured inorganic substrate layers.

3. The electronic circuit module according to claim 1, wherein at least one connection contact on the first side or on the second side of the at least one SiC power semiconductor is: (i) electrically connected, via a through-contact, to a connection contact which is arranged on the first side or on the second side of the multilayered LTCC circuit carrier, or (ii) electrically connected to an electronic component which is arranged on the first side or on the second side of the multilayered LTCC circuit carrier.

4. The electronic circuit module according to claim 1, wherein a high-current conductor path is embedded in the multilayered LTCC circuit carrier and is electrically connected, via at least one through-contact, to a corresponding connection contact on the first side or on the second side of the multilayered LTCC circuit carrier.

5. The electronic circuit module according to claim 4, wherein the high-current conductor path is electrically connected, via at least one second through-contact, to a corresponding connection contact on the first side or on the second side of the at least one SiC power semiconductor.

6. The electronic circuit module according to claim 4, wherein the high-current conductor path is electrically connected, via a contact surface, in a planar manner to a corresponding connection contact on the first side or on the second side of the at least one SiC power semiconductor.

7. The electronic circuit module according to claim 1, wherein the first side of the at least one SiC power semiconductor terminates in a flush manner with the first side of the multilayered LTCC circuit carrier, or the second side of the at least one SiC power semiconductor terminates in a flush manner with the second side of the multilayered LTCC circuit carrier.

8. The electronic circuit module according to claim 1, wherein the at least one SiC power semiconductor is enclosed on all four sides by the multilayered LTCC circuit carrier.

9. The electronic circuit module according to claim 1, wherein the at least one SiC power semiconductor is a MOSFET power switch.

10. A method used for manufacturing a multilayered LTCC circuit carrier for an electronic circuit module, the method comprising:
introducing at least one recess into at least one raw substrate layer having electrical and/or thermal conduction structures;
stacking several raw substrate layers including the at least one raw substrate layer, to form a raw substrate stack; and
inserting at least one SiC power semiconductor into the at least one recess;
laminating the raw substrate stack with the SiC power semiconductor under pressure and temperature; and
shrinking the laminated raw substrate stack in a pressure-assisted sintering process to form the multilayered LTCC circuit carrier with the SiC power semiconductor; and
bringing connection contacts of the SiC power semiconductor, via the pressure-assisted sintering process, into electrical contact with the electrical and/or thermal conduction structures of inorganic substrate layers, which are produced by the pressure-assisted sintering process from the raw substrate layers with the electrical and/or thermal conduction structures.

11. The method according to claim 10, wherein, prior to the stacking of the raw substrate layers, at least one further recess is introduced into at least one raw substrate layer, into which, during or after stacking, (i) at least one through-contact and/or at least one high-current conductor path and/or at least one thermally and electrically conductive insert is inserted as an additional electrical conduction structure, and/or (ii) at least one thermally and electrically conductive thick-film structure is printed as an additional electrical conduction structure.

12. The method according to claim 10, wherein the pressure-assisted sintering process shrinks each raw substrate layer in thickness so that the substrate layer produced is thinner than the raw substrate layer.

13. The method according to claim 12, wherein a height of the recess, which is introduced into at least one of the raw substrate layers, is higher than the SiC power semiconductor, wherein the height of the recess in the at least one raw substrate layer is selected so that a height of a shrunken recess in the at least one shrunken substrate layer corresponds to the height of the SiC power semiconductor, and the at least one SiC power semiconductor fills the corresponding shrunken recess.

* * * * *